United States Patent
Park et al.

(10) Patent No.: US 11,349,466 B2
(45) Date of Patent: May 31, 2022

(54) DELAY CIRCUIT AND PHASE INTERPOLATOR

(71) Applicant: SK hynix Inc., Gyeonggi-do (KR)

(72) Inventors: Ji Hwan Park, Gyeonggi-do (KR); Jun Il Moon, Gyeonggi-do (KR); Byung Kuk Yoon, Gyeonggi-do (KR); Myeong Jae Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/009,403

(22) Filed: Sep. 1, 2020

(65) Prior Publication Data

US 2021/0320651 A1 Oct. 14, 2021

(30) Foreign Application Priority Data

Apr. 9, 2020 (KR) .................. 10-2020-0043459

(51) Int. Cl.
*H03K 5/14* (2014.01)
*H03K 5/00* (2006.01)

(52) U.S. Cl.
CPC ..... *H03K 5/14* (2013.01); *H03K 2005/00052* (2013.01)

(58) Field of Classification Search
CPC .................. H03K 5/14; H03K 2005/00052
USPC ...................................................... 327/105
See application file for complete search history.

(56) References Cited

U.S. PATENT DOCUMENTS

| | | | | |
|---|---|---|---|---|
| 7,634,039 B2* | 12/2009 | Maneatis | ............... | H03L 7/089 375/376 |
| 7,772,898 B2 | 8/2010 | Cheung | | |
| 9,425,779 B2* | 8/2016 | Jung | ....................... | H03K 5/14 |
| 9,432,176 B2 | 8/2016 | Yu et al. | | |
| 9,800,234 B2 | 10/2017 | Tai et al. | | |
| 2002/0097592 A1* | 7/2002 | Komurasaki | ........... | H03D 3/06 363/157 |
| 2002/0196887 A1* | 12/2002 | Heikkila | ............. | H03K 5/1565 375/371 |
| 2006/0145745 A1* | 7/2006 | Deivasigamani | .... | H03K 5/1565 327/291 |
| 2009/0278579 A1* | 11/2009 | Kao | ..................... | H03K 21/023 327/153 |

FOREIGN PATENT DOCUMENTS

KR 10-2016-0065632 6/2016

* cited by examiner

*Primary Examiner* — Ryan Jager
(74) *Attorney, Agent, or Firm* — IP & T Group LLP

(57) ABSTRACT

A delay circuit includes a first delay line suitable for delaying a first clock by a delay value that is adjusted based on a delay control code; a delay control circuit suitable for comparing a phase of the first clock delayed through the first delay line with a phase of a second clock to generate the delay control code; and a second delay line having, based on a delay control code, a delay value corresponding to a half of the delay value of the first delay line.

18 Claims, 7 Drawing Sheets

FIG. 4
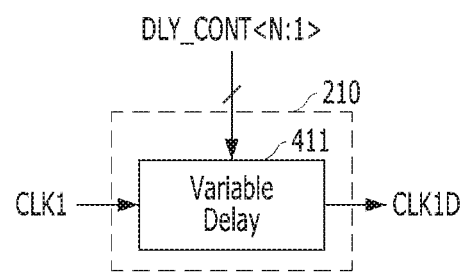
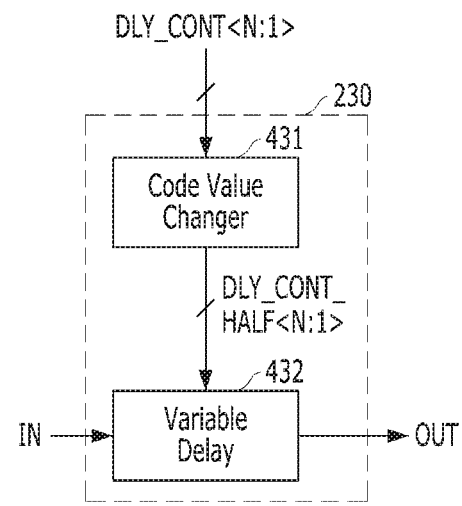

DELAY CIRCUIT AND PHASE INTERPOLATOR

CROSS-REFERENCE TO RELATED APPLICATION

This application claims priority under 35 U.S.C. § 119 to Korean Patent Application No. 10-2020-0043459 filed on Apr. 9, 2020, which is incorporated herein by reference in its entirety.

BACKGROUND

1. Field

Various embodiments relate to a delay circuit and a phase interpolator.

2. Discussion of the Related Art

In general, phase interpolators are used to generate clocks having various phases in a variety of integrated circuits. A phase interpolator receives plural clocks having different phases and synthesizes the received clocks, thereby generating an output clock having a middle phase between phases of the received clocks.

FIG. 1 is a diagram illustrating a conventional phase interpolator 100 and an operation thereof.

Referring to FIG. 1, the phase interpolator 100 may include inverters 101 and 102 for transferring a first input clock CLKA_IN, inverters 106 and 107 for transferring a second input clock CLKB_IN, and inverters 103 to 105 for synthesizing the first input clock CLKA_IN and the second input dock CLKB_IN.

FIG. 1 shows that the first input dock CLKA_IN and the second input clock CLKB_IN have a phase difference 'dT' therebetween, and an interpolated output clock CLKAB_OUT outputted from the phase interpolator 100 has a middle phase between a first output clock CLKA_OUT and a second output clock CLKB_OUT. This is because the interpolated output clock CLKAB_OUT is generated by merging analog components of the periods in which the first input clock CLKA_IN and the second input clock CLKB_IN transition.

When the phase difference 'dT' between the first input clock CLKA_IN and the second input clock CLKB_IN is large, the period in which the first input clock CLKA_IN transitions and the period in which the second input clock CLKB_IN transitions do not overlap each other. In this case, it is impossible to synthesize analog components of the two clocks CLKA_IN and CLKB_IN. Therefore, when two clocks CLKA_IN and CLKB_IN to be synthesized are low-frequency clocks, it is impossible to perform phase interpolation using the conventional phase interpolator 100 of FIG. 1.

SUMMARY

Various embodiments are directed to a phase interpolator capable of generating a middle phase clock between clocks having a phase difference therebetween.

In an embodiment, a delay circuit may include: a first delay line suitable for delaying a first clock by a delay value that is adjusted based on a delay control code; a delay control circuit suitable for comparing a phase of the first clock delayed through the first delay line with a phase of a second clock to generate the delay control code; and a second delay line having, based on a delay control code, a delay value corresponding to a half of the delay value of the first delay line.

In an embodiment, a phase interpolator may include: a first delay line suitable for delaying a first clock by a delay value that is adjusted based on a delay control code; a delay control circuit suitable for comparing a phase of the first clock delayed through the first delay line with a phase of a second clock to generate the delay control code; and a second delay line suitable for delaying, based on the delay control code, the first clock by a delay value corresponding to a half of the delay value of the first delay line, to generate a phase-interpolated clock.

In an embodiment, a phase interpolator may include: a first delay line suitable for delaying a first input clock by a delay value that is adjusted based on a delay control code; a delay control circuit suitable for comparing a phase of the first input clock delayed through the first delay line with a phase of a second input clock to generate the delay control code; a first driver suitable for outputting the first input clock delayed by the first delay line as a first output clock; a first synthesizer suitable for synthesizing the first input clock delayed through the first delay line and the second input clock to drive a first node with a synthesized clock; a second delay line suitable for delaying, based on the delay control code, the synthesized clock of the first node by a delay value corresponding to a half of the delay value of the first delay line, to output the delayed clock as a second output clock; a second driver suitable for transferring the second input clock to a second node; and a third delay line suitable for delaying the clock of the second node by a delay value that is adjusted based on the delay control code and equal to the delay value of the first delay line, to output the delayed clock as a third output clock.

In an embodiment, a phase interpolation method may include: delaying a first input clock by a delay value that is adjusted based on a delay control code; comparing a phase of the delayed first input clock with a phase of a second input clock to generate the delay control code configured to make the first and second input clocks in-phase; synthesizing the delayed first input clock and the second input clock to output a synthesized clock; delaying, based on the delay control code, the synthesized clock by a delay value corresponding to a half of the delay value of the first input clock, to output the delayed synthesized clock; delaying the second input clock by a delay value equal to the delay value of the first input clock, based on the delay control code.

The present embodiments may be able to generate a middle phase clock between clocks having a large phase difference therebetween.

BRIEF DESCRIPTION OF THE DRAWINGS

FIG. 4 is a detailed diagram illustrating a second embodiment of the first and second delay lines of FIG. 2.

DETAILED DESCRIPTION

Figure 1:
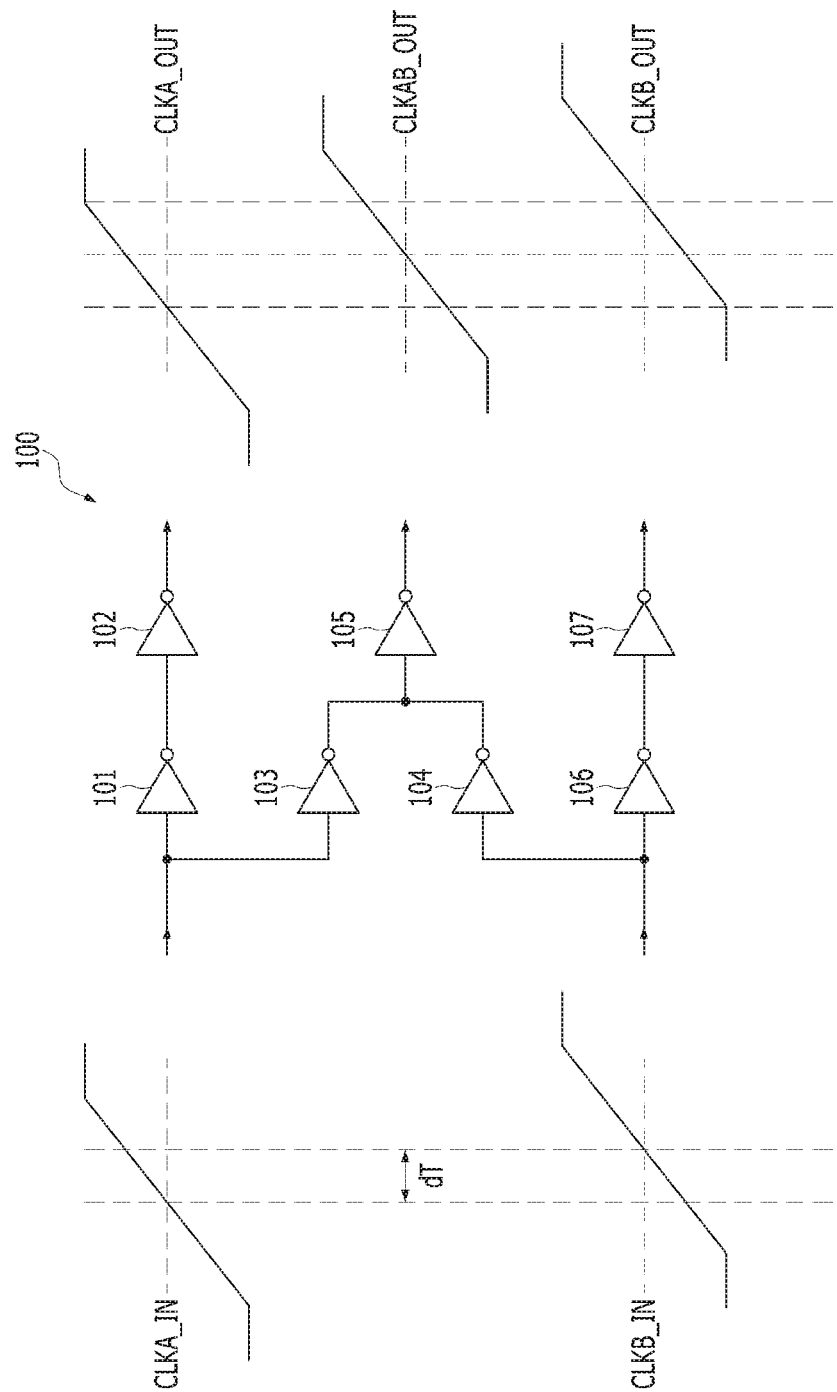
FIG. 1 is a diagram illustrating a conventional phase interpolator and an operation thereof.

Hereafter, various embodiments will be described with reference to the accompanying drawings, in order to describe the present disclosure in detail such that a person skilled in the art to which the present disclosure pertains can easily carry out the technical spirit of the present disclosure. In the descriptions of the present embodiment, components which are irrelevant to the subject matter of the present embodiment may be omitted. When reference numbers are given to components of the drawings, the same components will be represented by like reference numerals even though the components are illustrated in different drawings.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from context to be directed to a singular form.

Figure 2:
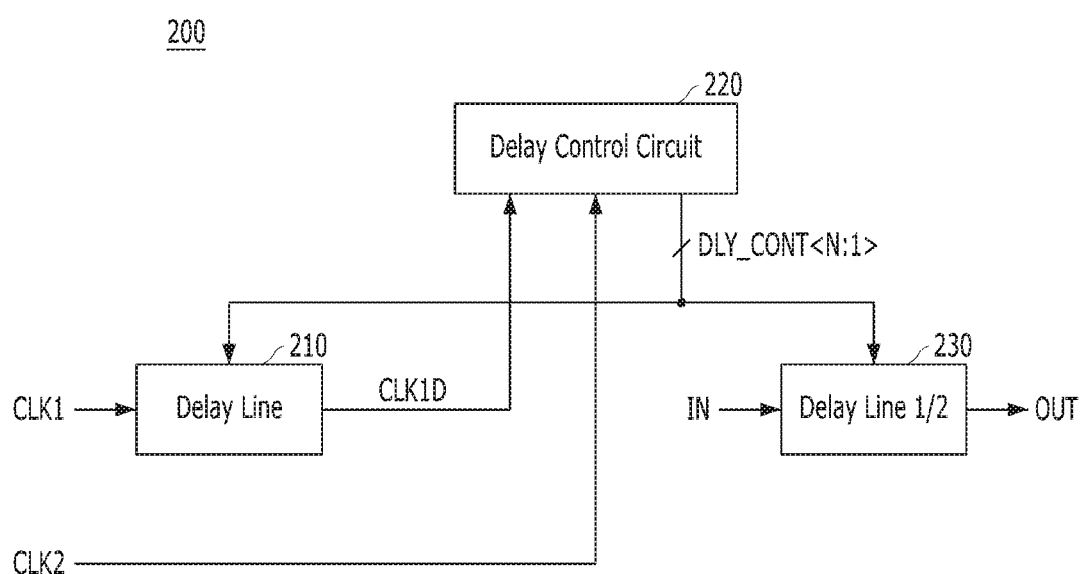
FIG. 2 is a diagram illustrating a delay circuit 200 in accordance with an embodiment of the present invention.

FIG. 2 is a diagram illustrating a delay circuit 200 in accordance with an embodiment of the present invention.

Referring to FIG. 2, the delay circuit 200 may include a first delay line 210, a delay control circuit 220 and a second delay line 230.

The first delay line 210 may generate a delayed first clock CLK1D by delaying a first clock CLK1. The first delay line 210 may have a delay value which is adjusted by a delay control code DLY_CONT<N:1>.

The delay control circuit 220 may generate the delay control code DLY_CONT<N:1> by comparing the phases of the delayed first clock CLK1D and the second clock CLK2. The delay control circuit 220 may increase or decrease the code value of the delay control code DLY_CONT<N:1> according to the result of the phase comparison between the delayed first clock CLK1D and a second clock CLK2. Therefore, the delay control circuit 220 may generate the delay control code DLY_CONT<N:1> such that the delayed first clock CLK1D and the second clock CLK2 are in phase, that is, the delay value of the first delay line 210 becomes equal to a phase difference between the first and second clocks CLK1 and CLK2.

The second delay line 230 may have a delay value which is adjusted by the delay control code DLY_CONT<N:1>, and corresponds to a half of the delay value of the first delay line 210. Since the second delay line 230 receives the same delay control code DLY_CONT<N:1> as the first delay line 210, the second delay line 230 may be designed to have a delay value corresponding to the half of the delay value of the first delay line 210. The second delay line 230 may be used to delay a random signal IN which needs to be delayed.

Referring to FIG. 2, the first delay line 210 may have a delay value corresponding to a phase difference between the first and second clocks CLK1 and CLK2, and the second delay line 230 may have a delay value corresponding to a half of the phase difference between the first and second clocks CLK1 and CLK2. Based on such characteristics, a phase interpolator which will be described below may be designed.

Figure 3:
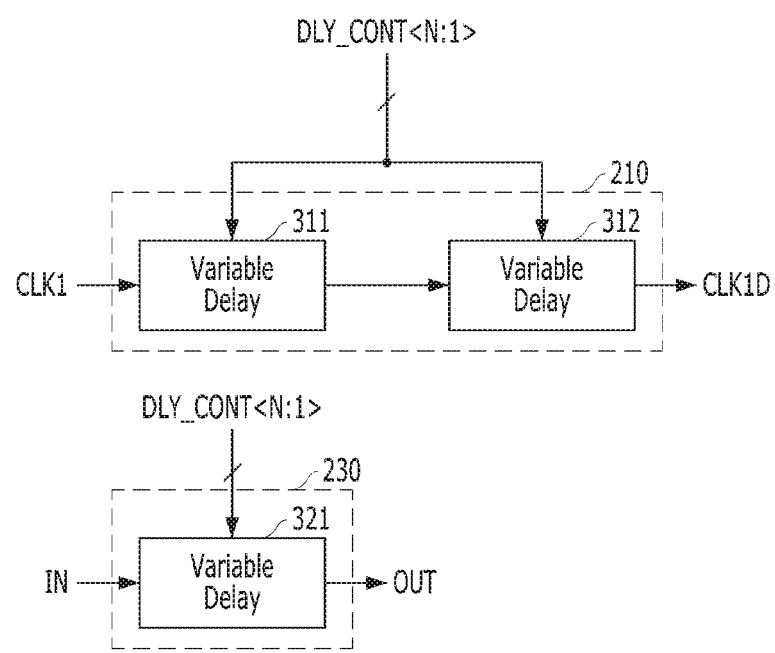
FIG. 3 is a detailed diagram illustrating a first embodiment of first and second delay lines of FIG. 2.

FIG. 3 is a detailed diagram illustrating a first embodiment of the first and second delay lines 210 and 230 of FIG. 2.

Referring to FIG. 3, the first delay line 210 may include two variable delays 311 and 312, and the second delay line 230 may include one variable delay 321.

The first delay line 210 may include a first variable delay 311 and a second variable delay 312 which are coupled in series. Each of the first and second variable delays 311 and 312 may have a delay value which is adjusted by the delay control code DLY_CONT<N:1>, and the first and second variable delays 311 and 312 may be designed in the same manner (i.e., may have the same configuration of elements) and have the same delay value.

The second delay line 230 may include a third variable delay 321. The third variable delay 321 may have a delay value which is adjusted by the delay control code DLY_CONT<N:1>. The third variable delay 321 may be designed in the same manner (i.e., may have the same configuration of elements) as the first variable delay 311 and have the same delay value as the first variable delay 311.

Since the first to third variable delays 311, 312 and 321 are designed in the same manner and receive the same delay control code DLY_CONT<N:1>, the delay values of the first to third variable delays 311, 312 and 321 may be equal to one another. Since the first delay line 210 includes two variable delays 311 and 312 coupled in series and the second delay line 230 includes one variable delay 321, the delay value of the first delay line 210 may be twice as large as that of the second delay line 230.

FIG. 4 is a detailed diagram illustrating a second embodiment of the first and second delay lines 210 and 230 of FIG. 2.

Referring to FIG. 4, the first delay line 210 may include a first variable delay 411. The first variable delay 411 may have a delay value which is adjusted by the delay control code DLY_CONT<N:1>.

The second delay line 230 may include a code value changer 431 and a second variable delay 432.

The code value changer 431 may generate a half delay control code DLY_CONT_HALF<N:1> by halving the code value of the delay control code DLY_CONT<N:1>. The half delay control code DLY_CONT_HALF<N:1> may be a code for controlling a delay value to ½ of the code value of the delay control code DLY_CONT<N:1>. The delay control code DLY_CONT<N:1> may have a binary code format or a thermometer code format. In any case, the code value changer 431 may generate the half delay control code DLY_CONT_HALF<N:1> such that the delay value corresponding to the half delay control code DLY_CONT_HALF<N:1> becomes the half of the delay value corresponding to the delay control code DLY_CONT<N:1>.

The second variable delay 432 may be designed in the same manner (i.e., may have the same configuration of elements) as the first variable delay 411, and have a delay value which is adjusted by the half delay control code DLY_CONT_HALF<N:1>. Therefore, the second variable delay 432 may have a delay value corresponding to the half of the delay value of the first variable delay 411.

Figure 5:
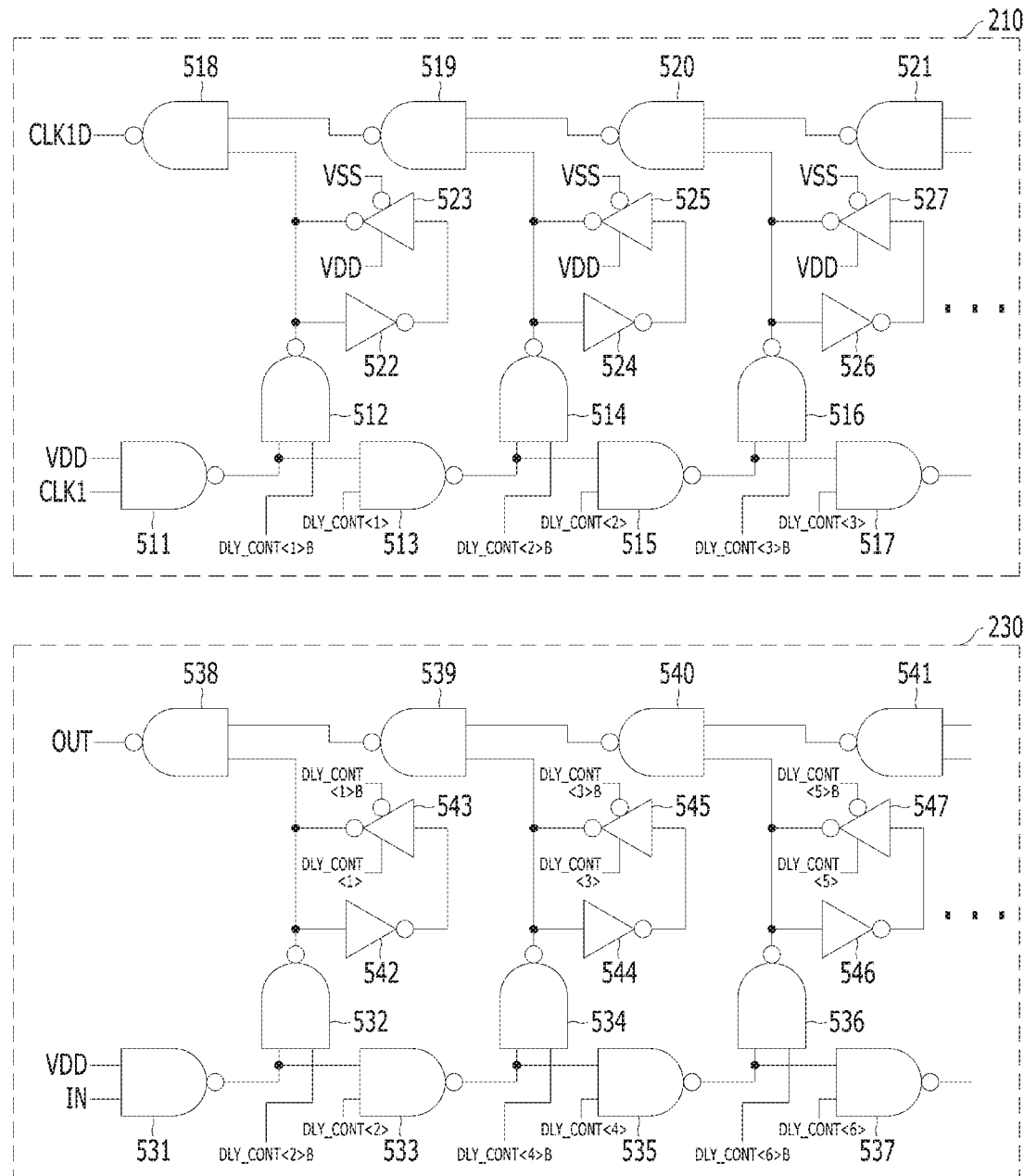
FIG. 5 is a detailed diagram illustrating a third embodiment of the first and second delay lines of FIG. 2.

FIG. 5 is a detailed diagram illustrating a third embodiment of the first and second delay lines 210 and 230 of FIG. 2. In FIG. 5, <1> to <N> may represent N bits of the delay control code DLY_CONT<N:1>. Furthermore, <1>B to <N>B may represent bits obtained by inverting N bits of the delay control code DLY_CONT<N:1>.

Referring to FIG. 5, the first delay line 210 may include NAND gates 511 to 521 and inverters 522 to 527. The first delay line 210 may have a delay value which is adjusted by the delay control code DLY_CONT<N:1>. When the delay control code has a value of 000 . . . 0.11, the first clock CLK1 may be delayed through the NAND gates 511, 513, 515, 516, 520, 519 and 518. Furthermore, when the delay control code DLY_CONT<N:1> has a value of 000 . . . 01, the first clock CLK1 may be delayed through the NAND gates 511, 513, 514, 519 and 518. The inverters 522 to 527 may serve as a latch which are used to form loading. According to the value of the delay control code DLY_CONT<N:1>, the path through which the first clock CLK1 passes in the first delay line 210 may be adjusted in the first delay line 210. That is, according to the value of the delay control code DLY_CONT<N:1>, one of the N paths may be selected, and the first clock CLK1 may be delayed by the selected path. For reference, NAND gates 512, 514, and 516 may select the path through which the first clock CLK1 passes in the first delay line 210.

The second delay line 230 may include NAND gates 531 to 541 and inverters 542 to 547. The second delay line 230 may have N/2 paths, and one of the N/2 paths may be selected by even code values DLY_CONT<2>, <4>, . . . , and <N> of the delay control code DLY_CONT<N:1>, and used to delay an input signal IN. Odd code values DLY_CONT<1>, <3>, . . . , and <N−1> of the delay control code DLY_CONT<N:1> may enable or disable a latch composed of the inverters 542 to 547, thereby adjusting loading. When the delay control code DLY_CONT<N:1> has a value of 000 . . . 11, the input signal IN may be delayed through the NAND gates 531, 533, 534, 539 and 538. In this case, the inverter 543 may be disabled. Thus, a latch formed by the inverters 544 and 545 may be disabled. When the delay control code DLY_CONT<N:1> has a value of 000 . . . 01, the input signal IN may be delayed through the NAND gates 531, 532 and 538. In this case, the inverter 543 may be enabled. Thus, a latch formed by the inverters 542 and 543 may be enabled to increase loading. For reference, NAND gates 542, 544, and 546 may select the path through which the input signal IN passes in the second delay line 230.

Figure 6:
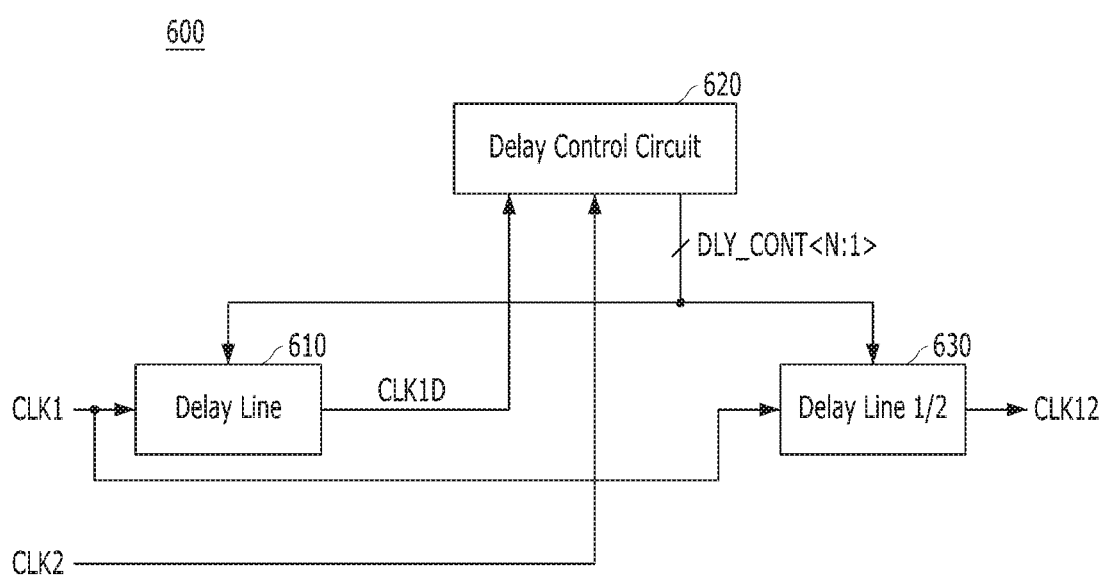
FIG. 6 is a diagram illustrating a phase interpolator in accordance with an embodiment of the present invention.

Since the delay values of the first and second delay lines 210 and 230 are adjusted by the same delay control code DLY_CONT<N:1>, and a path having a length corresponding to a half of the length of the first delay line 210 is selected in the second delay line 230, the second delay line 230 may have a delay value corresponding to the half of the delay value of the first delay line 210, FIG. 6 is a diagram illustrating a phase interpolator 600 in accordance with an embodiment of the present invention.

Referring to FIG. 6, the phase interpolator 600 may include a first delay line 610, a delay control circuit 620 and a second delay line 630.

The first delay line 610 may generate a delayed first clock CLK1D by delaying a first clock CLK1. The first delay line 610 may have a delay value which is adjusted by a delay control code DLY_CONT<N:1>. The first delay line 610 may be designed in the same manner (i.e., may have the same configuration of elements) as the first delay line 210.

The delay control circuit 620 may generate the delay control code DLY_CONT<N:1> by comparing the phases of the delayed first clock CLK1D and a second clock CLK2. The delay control circuit 620 may increase or decrease the code value of the delay control code DLY_CONT<N:1> according to the result of the phase comparison between the delayed first clock CLK1D and the second clock CLK2. Therefore, the delay control circuit 620 may generate the delay control code DLY_CONT<N:1> such that the delayed first clock CLK1D and the second clock CLK2 are in phase, that is, the delay value of the first delay line 610 becomes equal to a phase difference between the first and second clocks CLK1 and CLK2.

The second delay line 630 may have a delay value which is adjusted by the delay control code DLY_CONT<N:1>, and corresponds to a half of the delay value of the first delay line 610. Since the second delay line 630 receives the same delay control code DLY_CONT<N:1> as the first delay line 610, the second delay line 630 may be designed to have a delay value corresponding to the half of the delay value of the first delay line 610. The second delay line 630 may be designed in the same manner (i.e., may have the same configuration of elements) as the second delay line 230.

The second delay line 630 may generate a phase-interpolated dock CLK12 by delaying the first clock CLK1. Since the second delay line 630 has a delay value corresponding to a half of a phase difference between the first and second clocks CLK1 and CLK2 and the phase-interpolated clock CLK12 is obtained by delaying the first clock CLK1 through the second delay line 630, the phase-interpolated clock CLK12 may have a middle phase between the first and second clocks CLK1 and CLK2.

Figure 7:
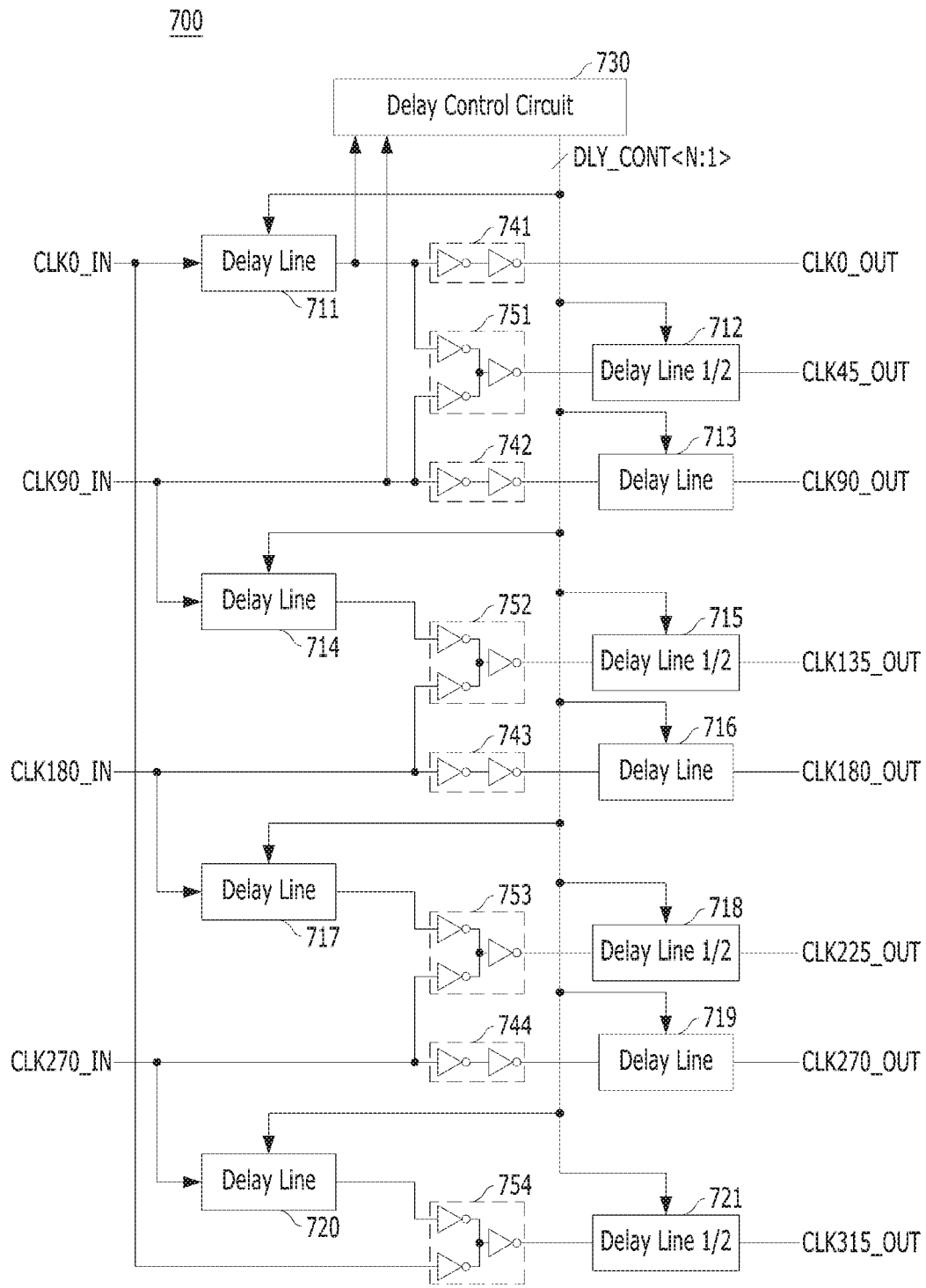
FIG. 7 is a diagram illustrating a phase interpolator in accordance with another embodiment of the present invention.

FIG. 7 is a diagram illustrating a phase interpolator 700 in accordance with another embodiment of the present invention. The phase interpolator 700 of FIG. 7 may generate eight output clocks CLK0_OUT, CLK45_OUT, CLK90_OUT, CLK135_OUT, CLK180_OUT, CLK225_OUT, CLK270_OUT and CLK315_OUT which have a phase difference of 45 degrees therebetween, using four input clocks CLK0_IN, CLK90_IN, CLK180_IN and CLK270_IN which have a phase difference of 90 degrees therebetween.

Referring to FIG. 7, the phase interpolator 700 may include first to eleventh delay lines 711 to 721, a delay control circuit 730, first to fourth drivers 741 to 744 and first to fourth synthesizers 751 to 754.

The first delay line 711 may have a delay value which is adjusted by a delay control code DLY_CONT<N:1>, and delay a first input dock CLK0_IN.

The delay control circuit 730 may generate the delay control code DLY_CONT<N:1> by comparing the phases of an output clock of the first delay line 711 and a second input clock CLK90_IN. As a result, the delay control circuit 730 may generate the delay control code DLY_CONT<N:1> such that the output clock of the first delay line 711 and the second input clock CLK90_IN are in phase, that is, the delay value of the first delay line 711 becomes equal to a phase difference between the first input clock CLK0_IN and the second input clock CLK90_IN.

The first driver 741 may output the output clock of the first delay line 711 as a first output clock CLK0_OUT. The first driver 741 may include two inverters coupled in series.

The first synthesizer 751 may synthesize the output clock of the first delay line 711 and the second input clock CLK90_IN, and transfer the synthesized clock to the second delay line 712. Since the output clock of the first delay line 711 and the second input clock CLK90_IN are in phase, it may be considered that the first synthesizer 751 transfers the two clocks to the second delay line 712. The first synthesizer 751 may include three inverters.

The second delay line 712 may have a delay value which is adjusted by the delay control code DLY_CONT<N:1>, and corresponds to a half of the delay value of the first delay line 711. That is, the second delay line 712 may have a delay value corresponding to a phase difference of 45 degrees between the docks. The second delay line 712 may delay the output clock of the first synthesizer 751, and output the delayed dock as a second output dock CLK45_OUT.

The second driver 742 may transfer the second input clock CLK90_IN to the third delay line 713. The second driver 742 may include two inverters coupled in series.

The third delay line 713 may have a delay value which is adjusted by the delay control code DLY_CONT<N:1>, and equal to the delay value of the first delay line 711. That is, the third delay line 713 may have a delay value corresponding to a phase difference of 90 degrees between clocks. The third delay line 713 may delay the output clock of the second driver, and output the delayed clock as a third output clock CLK90_OUT.

The fourth delay line 714 may have a delay value which is adjusted by the delay control code DLY_CONT<N:1>, and equal to the delay value of the first delay line 711, The fourth delay line 714 may delay the second input clock CLK90_IN.

The second synthesizer 752 may transfer the output clock of the fourth delay line 714 and a third input clock CLK180_IN to the fifth delay line 715. The second synthesizer 752 may include three inverters.

The fifth delay line 715 may have a delay value which is adjusted by the delay control code DLY_CONT<N:1>, and corresponds to a half of the delay value of the first delay line 711. The fifth delay line 715 may delay the output clock of the second synthesizer 752, and output the delayed clock as a fourth output clock CLK135_OUT.

The third driver 743 may transfer the third input clock CLK180_IN to the sixth delay line 716. The third driver 743 may include two inverters coupled in series.

The sixth delay line 716 may have a delay value which is adjusted by the delay control code DLY_CONT<N:1>, and equal to the delay value of the first delay line 711. The sixth delay line 716 may delay the output clock of the third driver 743, and output the delayed clock as a fifth output clock CLK180_OUT.

The seventh delay line 717 may have a delay value which is adjusted by the delay control code DLY_CONT<N:1>, and equal to the delay value of the first delay line 711. The seventh delay line 717 may delay the third input clock CLK180_IN.

The third synthesizer 753 may transfer the output clock of the seventh delay line 717 and a fourth input clock CLK270_IN to the eighth delay line 718. The third synthesizer 753 may include three inverters.

The eighth delay line 718 may have a delay value which is adjusted by the delay control code DLY_CONT<N:1>, and corresponds to a half of the delay value of the first delay line 711. The eighth delay line 718 may delay the output clock of the third synthesizer 753, and output the delayed dock as a sixth output clock CLK225_OUT.

The fourth driver 744 may transfer the fourth input clock CLK270_IN to the ninth delay line 719. The fourth driver 744 may include two inverters coupled in series.

The ninth delay line 719 may have a delay value which is adjusted by the delay control code DLY_CONT<N:1>, and equal to the delay value of the first delay line 711. The ninth delay line 719 may delay the output clock of the fourth driver 744, and output the delayed clock as a seventh output clock CLK270_OUT.

The tenth delay line 720 may have a delay value which is adjusted by the delay control code DLY_CONT<N:1>, and equal to the delay value of the first delay line 711. The tenth delay line 720 may delay the fourth input clock CLK270_IN.

The fourth synthesizer 754 may transfer the output clock of the tenth delay line 720 and the first input clock CLK0_IN to the eleventh delay line 721.

The eleventh delay line 721 may have a delay value which is adjusted by the delay control code DLY_CONT<N:1>, and corresponds to a half of the delay value of the first delay line 711. The eleventh delay line 721 may delay the output clock of the fourth synthesizer 754, and output the delayed clock as an eighth output clock CLK315_OUT.

In accordance with the embodiment of FIG. 7, the delay lines 711, 713, 714, 716, 717, 719 and 720 having a delay value corresponding to a phase difference of 90 degrees between clocks and the delay lines 712, 715, 718 and 721 having a delay value corresponding to a phase difference of 45 degrees between clocks may be combined so that the phase interpolator may be able to generate the clocks CLK0_OUT, CLK45_OUT, CLK90_OUT, CLK135_OUT, CLK180_OUT, CLK225_OUT, CLK270_OUT and CLK315_OUT having a desired phase.

In accordance with the embodiments of the present invention, even in a case where two clocks to be synthesized are low-frequency clocks, the two clocks may be synthesized after making the two clocks in-phase.

Although various embodiments have been described for illustrative purposes, it will be apparent to those skilled in the art that various changes and modifications may be made without departing from the spirit and scope of the invention as defined in the following claims.

What is claimed is:

1. A delay circuit comprising:
   a first delay line suitable for delaying a first clock by a delay value that is adjusted based on a delay control code;
   a delay control circuit suitable for comparing a phase of the first clock delayed through the first delay line with a phase of a second clock to generate the delay control code; and
   a second delay line having, based on the delay control code, a delay value corresponding to a half of the delay value of the first delay line.

2. The delay circuit of claim 1, wherein the delay control circuit is suitable for increasing or decreasing a code value of the delay control code according to a result of the phase comparison.

3. The delay circuit of claim 1, wherein the first delay line comprises:
   a first variable delay having a delay value adjusted based on the delay control code; and
   a second variable delay coupled in series to the first variable delay, and having a same configuration of elements as the first variable delay, wherein the second delay line comprises a third variable delay having a same configuration of elements as the first variable delay.

4. The delay circuit of claim 1, wherein the first delay line comprises a first variable delay having a delay value adjusted based on the delay control code,
wherein the second delay line comprises:
a code value changer suitable for halving the code value of the delay control code to generate a half delay control code; and
a second variable delay having a delay value adjusted based on the half delay control code, and having a same configuration of elements as the first variable delay.

5. The delay circuit of claim 1, wherein the delay control code comprises N delay control signals,
wherein the first variable delay comprises N delay paths, and one of the N delay paths is selected by the N delay control signals,
wherein the second variable delay comprises N/2 delay paths, and one of the N/2 delay paths is selected by a half of the N delay control signals.

6. The delay circuit of claim 5, wherein the other half of the delay control signals, which is not used when the second variable delay selects the delay path, is used to adjust loading of the variable delay.

7. A phase interpolator comprising:
a first delay line suitable for delaying a first clock by a delay value that is adjusted based on a delay control code;
a delay control circuit suitable for comparing a phase of the first clock delayed through the first delay line with a phase of a second clock to generate the delay control code; and
a second delay line suitable for delaying, based on the delay control code, the first clock by a delay value corresponding to a half of the delay value of the first delay line, to generate a phase-interpolated clock.

8. The phase interpolator of claim 7, wherein the delay control is suitable for increasing or decreasing a code value of the delay control code according to a result of the phase comparison.

9. The phase interpolator of claim 7, wherein the first delay line comprises:
a first variable delay having a delay value adjusted based on the delay control code; and
a second variable delay coupled in series to the first variable delay, and having a same configuration of elements as the first variable delay,
wherein the second delay line comprises a third variable delay having a same configuration of elements as the first variable delay.

10. The phase interpolator of claim 7, wherein the first delay line comprises a first variable delay having a delay value adjusted based on the delay control code,
wherein the second delay line comprises:
a code value changer suitable for halving the code value of the delay control code to generate a half delay control code; and
a second variable delay having a delay value adjusted by the half delay control code, and having a same configuration of elements as the first variable delay.

11. The phase interpolator of claim 7, wherein the delay control code comprises N delay control signals,
wherein the first variable delay comprises N delay paths, and one of the N delay paths is selected by the N delay control signals,
wherein the second variable delay comprises N/2 delay paths, and one of the N/2 delay paths is selected by a half of the N delay control signals.

12. The phase interpolator of claim 11, wherein the other half of the delay control signals, which is not used when the second variable delay selects the delay path, is used to adjust loading of the variable delay.

13. A phase interpolator comprising:
a first delay line suitable for delaying a first input clock by a delay value that is adjusted based on a delay control code;
a delay control circuit suitable for comparing a phase of the first input clock delayed through the first delay line with a phase of a second input clock to generate the delay control code;
a first driver suitable for outputting the first input clock delayed by the first delay line as a first output clock;
a first synthesizer suitable for synthesizing the first input clock delayed through the first delay line and the second input clock to drive a first node with a synthesized clock;
a second delay line suitable for delaying, based on the delay control code, the synthesized clock of the first node by a delay value corresponding to a half of the delay value of the first delay line, to output the delayed clock as a second output clock;
a second driver suitable for transferring the second input clock to a second node; and
a third delay line suitable for delaying the clock of the second node by a delay value that is adjusted based on the delay control code and equal to the delay value of the first delay line, to output the delayed clock as a third output clock.

14. The phase interpolator of claim 13, further comprising:
a fourth delay line suitable for delaying the second input clock by a delay value that is adjusted based on the delay control code and equal to the delay value of the first delay line;
a second synthesizer suitable for synthesizing the second input clock delayed through the fourth delay line and a third input clock to drive a third node with a synthesized clock;
a fifth delay line suitable for delaying, the delay control code, the synthesized clock of the third node by a delay value corresponding to a half of the delay value of the first delay line, to output the delayed clock as a fourth output clock;
a third driver suitable for transferring the third input clock to a fourth node; and
a sixth delay line suitable for delaying the clock of the fourth node by a delay value that is adjusted based on the delay control code and equal to the delay value of the first delay line, to output the delayed clock as a fifth output clock.

15. The phase interpolator of claim 14, further comprising:
a seventh delay line suitable for delaying the third input clock by a delay value that is adjusted based on the delay control code and equal to the delay value of the first delay line;
a third synthesizer suitable for synthesizing the third input clock delayed through the seventh delay line and a fourth input clock to drive a fifth node with a synthesized clock;
an eighth delay line suitable for delaying, based on the delay control code, the synthesized clock of the fifth node by a delay value corresponding to a half of the delay value of the first delay line, to output the delayed clock as a sixth output clock;

a fourth driver suitable for transferring the fourth input clock to a sixth node; and a ninth delay line suitable for delaying the clock of the sixth node by a delay value that is adjusted based on the delay control code and equal to the delay value of the first delay line, to output the delayed clock as a seventh output clock.

16. The phase interpolator of claim 15, further comprising:

a tenth delay line suitable for delaying the fourth input clock by a delay value that is adjusted based on the delay control code and equal to the delay value of the first delay line;

a fourth synthesizer suitable for synthesizing the fourth input clock delayed through the tenth delay line and the first input clock to drive a seventh node with a synthesized clock; and an eleventh delay line suitable for delaying, based on the delay control code, the synthesized clock of the seventh node by a delay value corresponding to a half of the delay value of the first delay line, to output the delayed clock as an eighth output clock.

17. The phase interpolator of claim 13, wherein the delay control circuit is suitable for increasing or decreasing a code value of the delay control code according to a result of the phase comparison.

18. A phase interpolation method comprising:

delaying a first input clock by a delay value that is adjusted based on a delay control code;

comparing a phase of the delayed first input clock with a phase of a second input clock to generate the delay control code configured to make the first and second input clocks in-phase;

synthesizing the delayed first input clock and the second input clock to output a synthesized clock;

delaying, based on the delay control code, the synthesized clock by a delay value corresponding to a half of the delay value of the first input clock, to output the delayed synthesized clock; and delaying the second input clock by a delay value equal to the delay value of the first input clock, based on the delay control code.

* * * * *